United States Patent [19]
Lee et al.

[11] Patent Number: 5,894,107
[45] Date of Patent: Apr. 13, 1999

[54] CHIP-SIZE PACKAGE (CSP) USING A MULTI-LAYER LAMINATED LEAD FRAME

[75] Inventors: Kyu Jin Lee, Seongnam; Do Soo Jeong, Suwon; Wan Gyan Choi, Seongnam; Tae Gyeong Chung, Suwon, all of Rep. of Korea

[73] Assignee: Samsung Electronics Co., Ltd., Suwon-city, Rep. of Korea

[21] Appl. No.: 08/904,756

[22] Filed: Aug. 1, 1997

[30] Foreign Application Priority Data

Aug. 19, 1996 [KR] Rep. of Korea ............. 96-34274

[51] Int. Cl.$^6$ ............................................. H01L 23/28
[52] U.S. Cl. ............. 174/52.2; 174/52.4; 257/676; 257/693; 257/738; 257/778; 257/787
[58] Field of Search ................ 257/676, 778, 257/669, 672, 673, 674, 666, 737, 738, 693, 787; 174/52.4, 52.2

[56] References Cited

U.S. PATENT DOCUMENTS

| | | | |
|---|---|---|---|
| 5,157,480 | 10/1992 | McShane et al. | 257/693 |
| 5,663,594 | 9/1997 | Kimura | 257/666 |
| 5,668,405 | 9/1997 | Yamashita | 257/668 |
| 5,677,566 | 10/1997 | King et al. | 257/666 |

*Primary Examiner*—Kristine Kincaid
*Assistant Examiner*—Hung V. Ngo
*Attorney, Agent, or Firm*—Jones & Volentine, L.L.P.

[57] ABSTRACT

A method for manufacturing a chip-size package and the chip-size package produced by the method uses first and second lead frames which are prepared by a stamping process. The first lead frame has leads with receiving parts, and the leads are integrally formed with lengthwise side rails of the lead frame. The second lead frame has external connections which align with the receiving parts of the leads when the second lead frame is positioned on top of the first lead frame and attached thereto. Guide holes located on the crosswise side rails of both lead frames can be used to easily align the two lead frames. A semiconductor chip is then adhered to the underside of the first lead frame, and the bonding pads of the semiconductor chip are electrically connected to the leads of the first lead frame. Then the two lead frames and the chip are encapsulated, with only the external connections of the second lead frame remaining exposed to the outside. Solder balls are then attached to the external connections for mounting onto a substrate. This chip-size package is inexpensive to produce, because the first and second lead frames can be produced by a stamping process, which is less complex and cheaper than the conventional half-etching process.

9 Claims, 6 Drawing Sheets

CHIP-SIZE PACKAGE (CSP) USING A MULTI-LAYER LAMINATED LEAD FRAME

BACKGROUND OF THE INVENTION

1. Field of the Invention

The present invention generally relates to a method for manufacturing a chip-size package (CSP), and the chip-size package produced by the method, and more particularly to a method for manufacturing a chip-size package using a multi-layer laminated lead frame.

2. Background of the Related Art

The miniaturization and multi-funtionalization of electronic equipment has resulted in the advancement of manufacturing technologies for semiconductor devices. This advancement includes progress in packaging technology toward high mounting density, high processing speed and miniaturization.

The mounting density of the chip package on a substrate has gradually increased, as the structure of the package has changed from the insert mounting type to the surface mounting type (SMT).

Due to this recent trend toward high mounting density of the package on a substrate, the kind of package has been changed from dual inline package (DIP) to small outline package (SOP), and then to thin small outline package (TSOP) whose thickness is as small as one-half that of a conventional SOP.

Particularly, in the case of the memory semiconductor chip, the size of the semiconductor chip increases as the capacity increases. If the size of the semiconductor chip increases, it is difficult to meet the reliability requirement of the package with the conventional plastic package technology.

Accordingly, a so-called chip-size package which has the same size or is slightly larger than the chip itself has been developed to satisfy this need.

The chip-size package has some advantages in that it is smaller and thinner than any other package type, it provides better electrical performance than most SMT packages due to shorter leads and lower lead inductance, and that it is easier to handle than a bare chip.

Many semiconductor manufacturers are developing various types of chip-size packages. The chip-size packages are classified into flexible circuit interposer type, rigid substrate interposer type, transfer molded, type, custom lead frame type, and TCP (Tape Carrier Package) type. Among these chip-size packages, the chip-size package employing LOC (Lead On Chip) technology can meet the demand for high density of the package.

An example of the chip-size package employing LOC technology is as follows. FIG. 1 is a cross-sectional view showing an example of the chip-size package employing the LOC technology, and FIG. 2 is an enlarged view of the lead portions of the chip-size package in FIG. 1.

Referring to FIG. 1 and FIG. 2, an active surface of the semiconductor chip 72 is attached to the lower surface of the leads 76 by using a double-sided adhesive tape 78 in the chip-size package 70. Because the upper surfaces of the leads 76 were partially etched by the half-etching method in the manufacturing process of the lead frame, the inner portions of the leads 76 are thin and the outer portions of the leads 76 are thick. Accordingly, the leads 76 are L-shaped.

The upper surfaces of the thin portions of the leads 76 and the bonding pads 74 of the semiconductor chip 72 are electrically interconnected by gold (Au) wires 80. The semiconductor chip 72 and the leads 76 including the bonding pads 74 and the gold wires 80 are encapsulated with an epoxy molding compound 82 so that the semiconductor chip 72 and the gold wires 80 are protected from the external environment, and the upper surfaces of the thick portions of the leads 76 are exposed to the outside for the next level electrical connection such as mounting to a substrate.

The conventional chip-size package using the lead frame which is manufactured by using the half-etching method as shown above has at least one drawback, in that the manufacturing process of the lead frame is complicated and expensive, compared to a lead frame which is manufactured by using a stamping method.

SUMMARY OF THE INVENTION

Accordingly, an object of the present invention is to provide a simplified chip-size package and a simplified method for manufacturing the chip-size package using a lead frame, which has a reduced manufacturing cost since the lead frame is manufactured using a stamping method.

The foregoing object can be achieved by a method for manufacturing a chip-size package, which comprises the steps of:

preparing a first lead frame and a second lead frame by a stamping process, the first lead frame having a plurality of rows of leads having receiving parts, the leads being integrally formed with the lengthwise side rails of the first lead frame, and the second lead frame having a plurality of rows of external connection means extending parallel to the lengthwise side rails of the second lead frame, the rows of external connection means being attached to the crosswise side rails of the second lead frame using tiebars;

aligning the first lead frame to the second lead frame by aligning corresponding guide holes located on the crosswise side rails of the first and second lead frames, and joining the second lead frame to the first lead frame by a welding or soldering process such that the receiving parts of the leads of the first lead frame are aligned with and located beneath the external connection means of the second lead frame;

cutting off the tiebars which had secured the rows of external connection means in place on the second lead frame by using a punching method;

attaching a semiconductor chip having a plurality of bonding pads on its active surface to the leads of the first lead frame by using an adhesive means;

electrically interconnecting the bonding pads of the semiconductor chip to the inner ends of the leads of the first lead frame using a wire-bonding method;

encapsulating the entire assembly in an encapsulant, with the upper surfaces of the external connection means exposed to the outside;

cutting off unnecessary parts of the first and second lead frames using a punching method; and attaching solder balls to the exposed upper surfaces of the external connection means.

BRIEF DESCRIPTION OF THE ATTACHED DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF PREFERRED EMBODIMENT

A preferred embodiment of the present invention will be described below with reference to the accompanying drawings.

FIG. 3 to FIG. 11 are the views showing the results of each step in the manufacturing process of a chip-size package according to the present invention.

Figure 10:
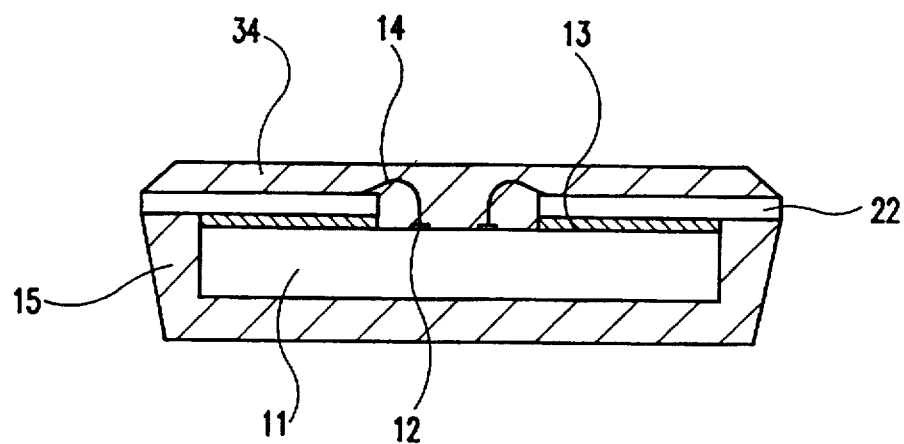
FIG. 10 is a cross-sectional view showing the encapsulated assembly of FIG. 9, with the unnecessary parts of the first lead frame and the second lead frame cut off.
Figure 11:
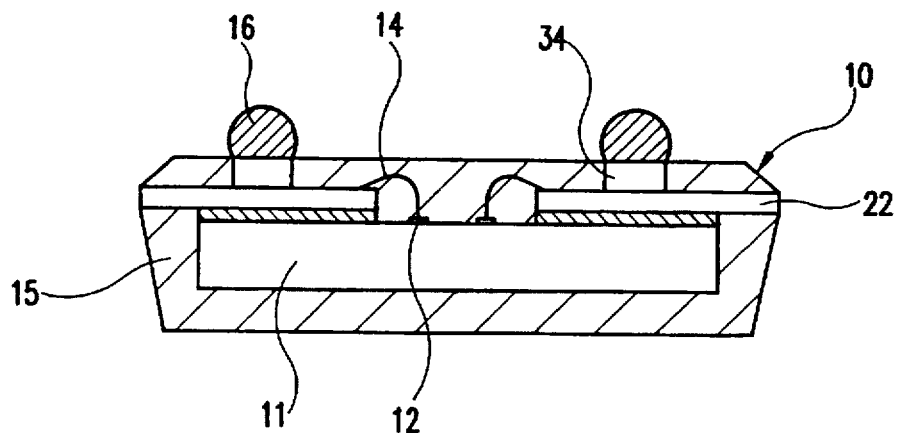
FIG. 11 is a cross-sectional view showing solder balls attached to the exposed upper surfaces of the external connection means of the encapsulated assembly of FIG. 10; and, FIG. 12 is a flow chart illustrating the steps of the method for manufacturing the chip-size package of the present invention.
Figure 12:
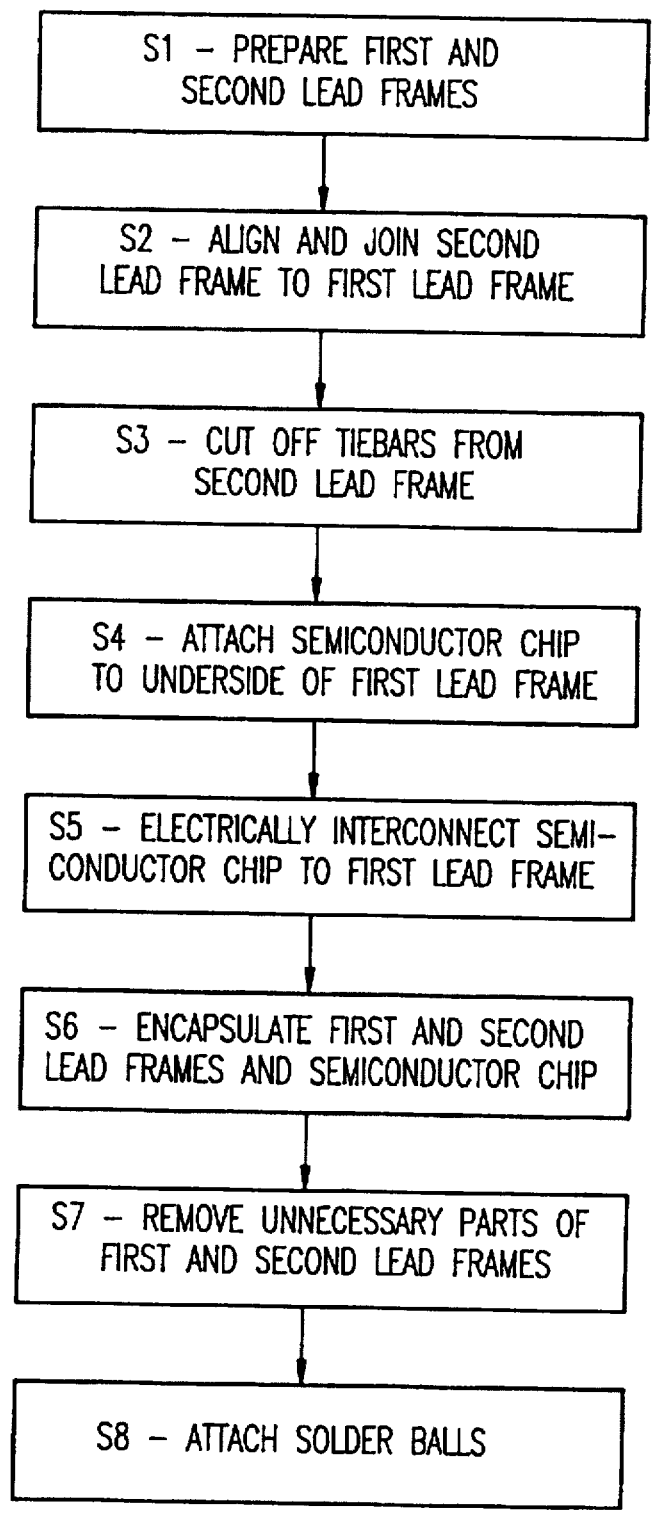

FIG. 12 is a flow chart showing the manufacturing steps of the method for producing the chip-size package shown in FIGS. 3–11.

Figure 1:
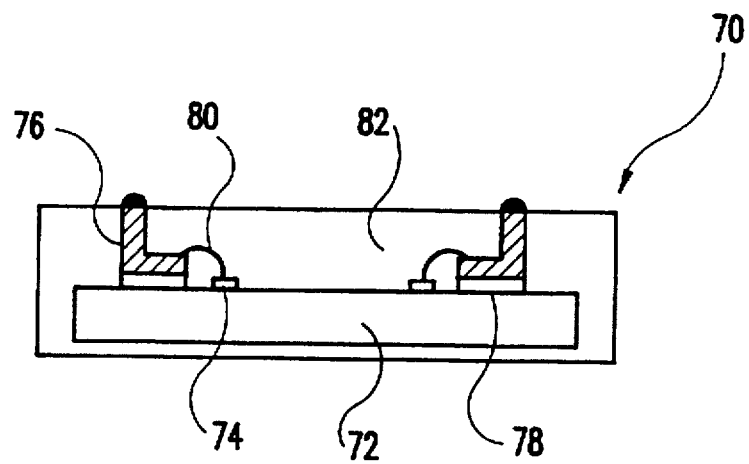
FIG. 1 is a cross-sectional view showing an example of the conventional chip-size package employing LOC technology.
Figure 2:
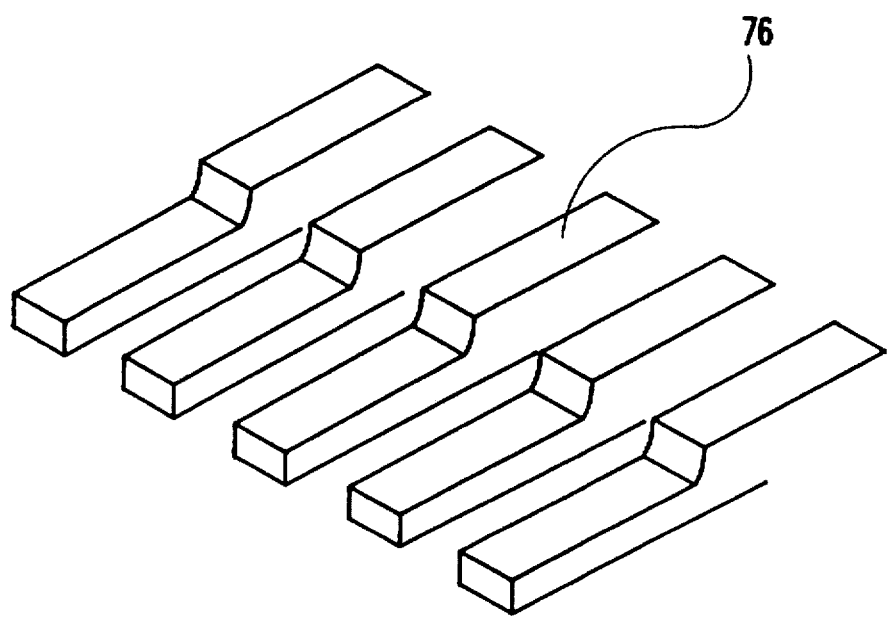
FIG. 2 is an enlarged view of the lead portions of the chip-size package as shown in FIG. 1.
Figure 3:
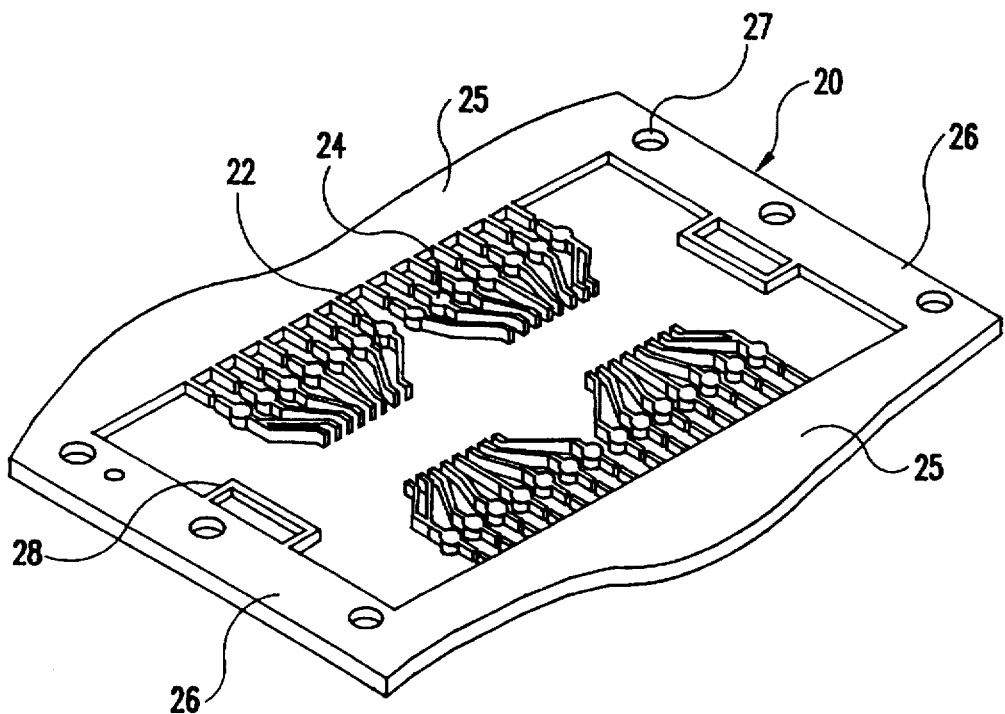
FIG. 3 is a perspective view showing the first lead frame according to the present invention.
Figure 4:
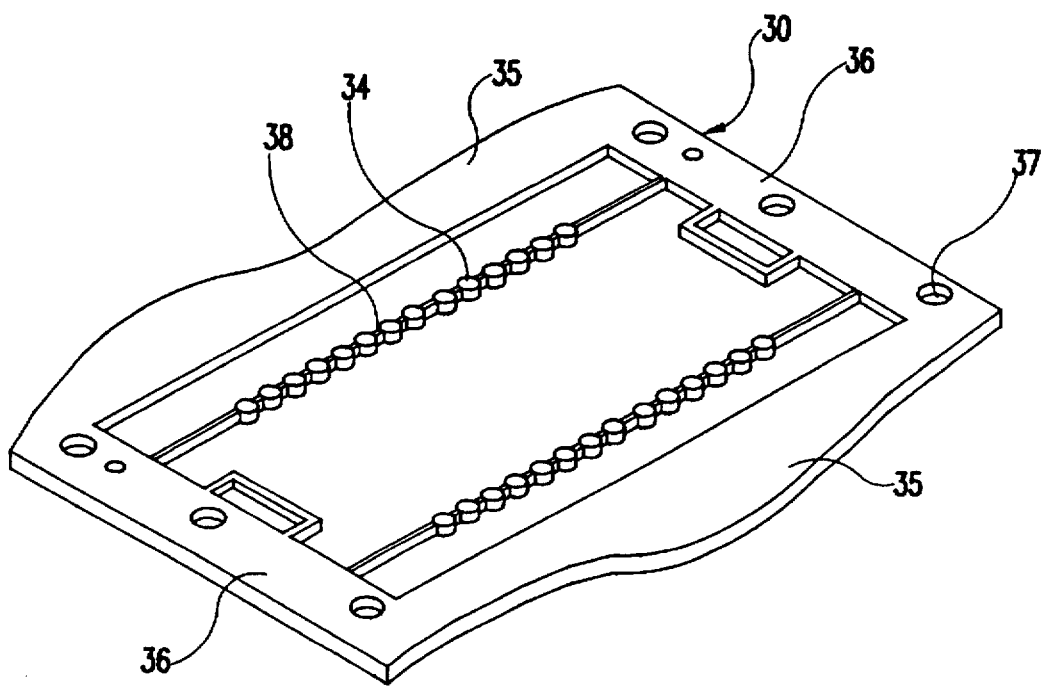
FIG. 4 is a perspective view showing the second lead frame according to the present invention.

A first lead frame 20 and a second lead frame 30 are prepared using a stamping method. Referring to FIG. 3 and FIG. 4, the first lead frame 20 comprises a pair of crosswise side rails 26, a pair of lengthwise side rails 25, and a plurality of leads 22 equally spaced at a designated distance along the lengthwise side rails 25.

The leads 22 are formed in two rows, each row extending inwardly toward the other row from one of the lengthwise side rails 25. The inner ends of the leads 22 arranged in one row are separated a designated distance from the inner ends of the leads 22 arranged in the other row.

The outer ends of the respective leads 22 are connected with the two lengthwise side rails 25 of the first lead frame 20 for providing mechanical support. Each lead 22 is integrally formed with a receiving part 24 which is formed in a disk shape and which is disposed at an approximate middle of the lead 22. Crosswise side rails 26 connect lengthwise side rails 25 together at either end of the rows of leads 22. Guide through-holes 27 are formed in the crosswise side rails 26. A tiebar 28 is formed on each crosswise side rail 26 as shown in FIG. 3.

Second lead frame 30 comprises a pair of lengthwise side rails 35 and a pair of crosswise side rails 36, similar to first lead frame 20. A plurality of external connection means 34 are formed in two rows and are connected to each other by tiebars 38. An end of each tiebar 38 is attached to one of the crosswise side rails 36, such that each row of external connection means 34 is spaced parallel to and at a designated distance from the lengthwise side rails 35. Each one of the external connection means 34 is formed in a disk shape, and one row of external connection means 34 is separated from the other row of external connection means 34 by a designated distance.

The size of the second lead frame 30 is the same as that of the first lead frame 20, and when the second lead frame 30 is placed on top of the first lead frame 20, the rows of external connection means 34 of the second lead frame 30 are disposed on top of the receiving parts 24 of the first lead frame 20. Crosswise side rails 36 connect lengthwise side rails 35 together, and guide through-holes 37 are formed in the crosswise side rails 36.

The diameter of each disk of the external connection means 34 of the second lead frame 30 is equal to or larger than the diameter of each disk of the receiving parts 24 of the first lead frame 20. This insures that a punching means (not shown) used to cut off the tiebars 38 will not damage the receiving parts 24 of the first lead frame 20. The external connection means 34 of the second lead frame 30 are spaced apart from one another the same distance that the receiving parts 24 of the first lead frame 20 are spaced apart from one another.

Further, the guide through-holes 37 in second lead from 30 are disposed on a position corresponding to the guide through-holes 27 in the first lead frame 20, and the size and the shape of the guide through-holes 37 are the same as those of the guide through-holes 27.

Figure 5:
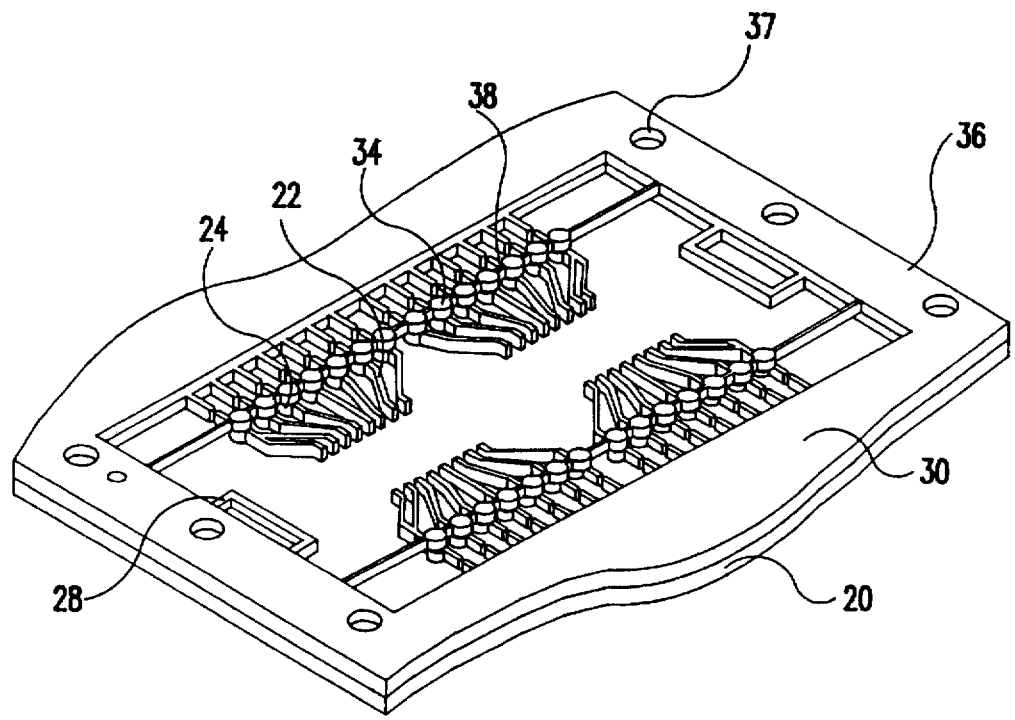
FIG. 5 is a perspective view showing the second lead frame of FIG. 4 joined to the first lead frame of FIG. 3.

FIG. 5 shows the second lead frame 30 aligned on top of the first lead frame 20. The second lead frame 30 and the first lead frame 20 are joined by welding or soldering so that the external connection means 34 of the second lead frame 30 are aligned and joined to the corresponding receiving parts 24 of the first lead frame 20. If the guide through-holes 37 of the second lead frame 30 and the guide through-holes 27 of the first lead frame 20 are exactly aligned, the external connection means 34 of the second lead frame 30 can be aligned on top of the receiving parts 24 of the first lead frame 20.

Figure 6:
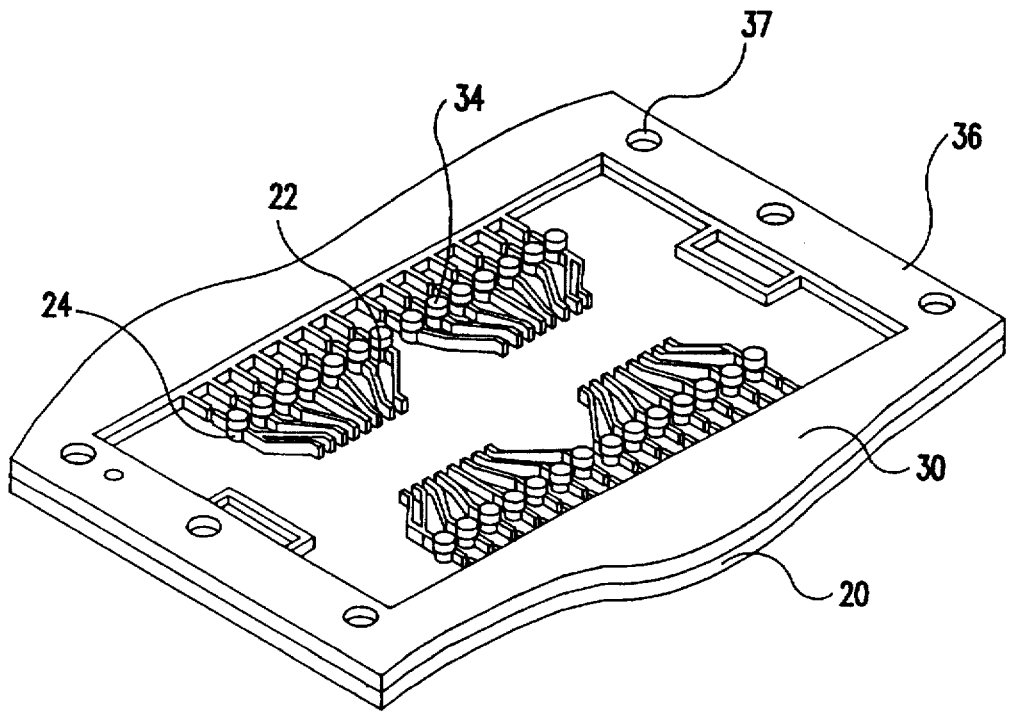
FIG. 6 is a perspective view showing the first and second lead frames of FIG. 5 with the tiebars cut off of the second lead frame.

FIG. 6 shows the assembly of FIG. 5 after cutting off the tiebars 38 from the second lead frame 30. The tiebars 38 of the second lead frame 30 are cut off by using a punching means (not shown). At this time, the punching means does not damage the receiving parts 24 of the first lead frame 20, because the external connection means 34 covers the receiving parts 24 of the first lead frame 20. After tiebars 38 are cut off, the external connection means 34 of the second lead frame 30 are aligned on the corresponding receiving parts 24 of the first lead frame 20.

Figure 7:
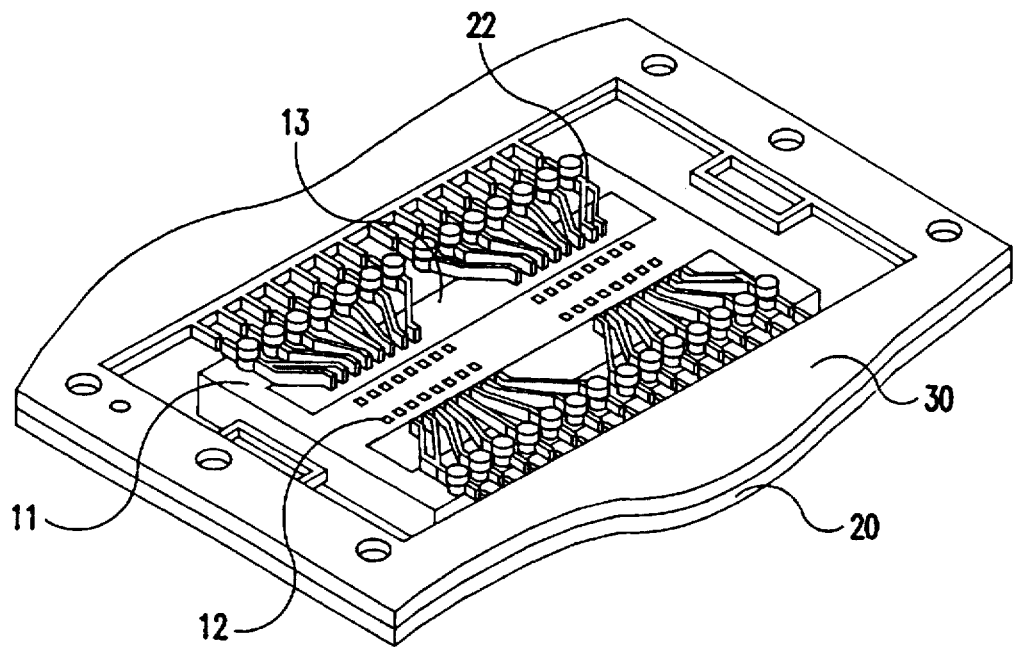
FIG. 7 is a perspective view showing the active surface of the semiconductor chip attached to the lower surface of the first lead frame.

FIG. 7 shows a semiconductor chip 11 attached to the first lead frame 20 by using an adhesive means such as a double-sided adhesive polyimide tape or a non-conductive adhesive 13. On the semiconductor chip 11, the bonding pads 12 are disposed in two rows at a central region of an active surface of the chip. One surface of the double-sided adhesive polyimide tape 13 is attached to the lower surface of the first lead frame 20 by thermocompression bonding.

Then, the other surface of the double-sided adhesive polyimide tape 13 is attached to the active surface of the semiconductor chip 11 by thermocompression with the exposed bonding pads 12. At this time, a non-conductive adhesive may be used instead of the double-sided adhesive polyimide tape 13.

Figure 8:
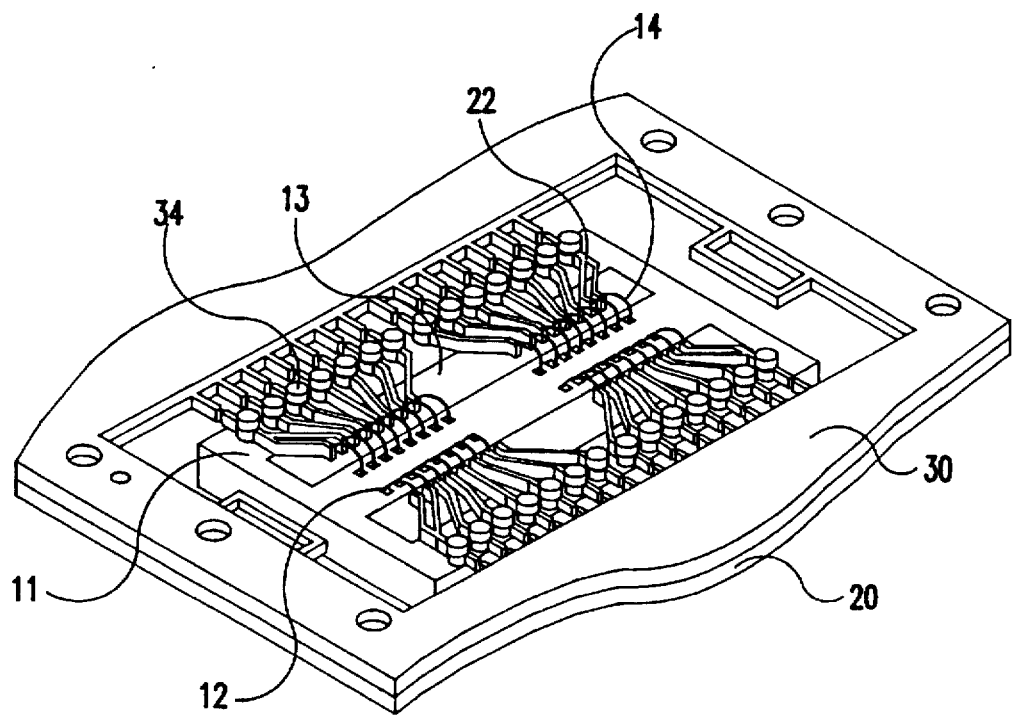
FIG. 8 is a perspective view showing the assembly of FIG. 7, after wire-bonding.

FIG. 8 shows the assembly of FIG. 7 with bonding wires 14 connecting the bonding pads 12 of the chip 11 to the leads 22 of the first lead frame 20. The bonding pads 12 disposed at the central region of the active surface of the semiconductor chip 11 and the inner ends of the corresponding leads 22 are electrically interconnected by bonding wires, e.g. gold wires 14. The bonding pads 12 of the semiconductor chip 11 and the external connection means 34 of the second lead frame 30 are thereby electrically interconnected by a wire-bonding technique. It is possible to employ various techniques such as a bump bonding or a bonding method like TAB bonding for electrically connecting the bonding pads 12 to the leads 22 of first lead frame 20.

Figure 9:
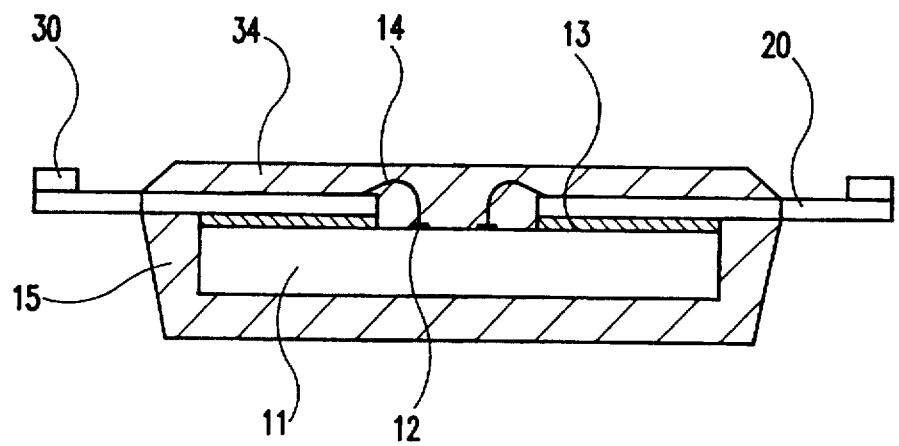
FIG. 9 is a cross-sectional view showing the semiconductor chip, the first lead frame and the second lead frame including the bonding pads and the bonding wires of FIG. 8 encapsulated with an encapsulant.

FIG. 9 shows a cross-sectional view of the assembly of FIG. 8 after encapsulation, so that the upper surfaces of the external connection means 34 are exposed toward the outside for electrical connection to the external interconnections. The semiconductor chip 11, the first lead frame 20 and the second lead frame 30 including the bonding pads 12 and the gold wires 14 are encapsulated with an encapsulant such as an epoxy molding compound 15 (hereinafter referred to as "EMC"), in order to protect them from the external environment.

FIG. 10 shows the assembly of FIG. 9 after the unnecessary parts of the first lead frame 20 and the second lead frame 30 have been cut off. The lead portions of the first lead frame 20 which protrude from the encapsulated package body are cut off by using the punching means after the encapsulation step. At the same time, the lead portions of the second lead frame 30 which protrude from the encapsulated package body are also cut off.

FIG. 11 shows the assembly of FIG. 10 after solder balls have been attached to the package. The metal balls, e.g. solder balls 16, are attached to the exposed upper surfaces of the external connection means 34 of the second lead frame 30 for an easy mounting onto a substrate (not shown).

The method for manufacturing the chip-size package as described above is illustrated in the flow chart of FIG. 12. The manufacturing steps are as follows: (1) preparing a first lead frame and a second lead frame by a stamping process (S1), the first lead frame having a plurality of rows of leads having receiving parts, the leads and the receiving parts being integrally formed with each other and with the lengthwise side rails of the lead frame, the second lead frame having a plurality of rows of external connection means extending parallel to the lengthwise side rails of the lead frame, the rows of external connection means being attached to the crosswise side rails of the second lead frame with tiebars; (2) aligning the first lead frame to the second lead frame by aligning corresponding guide holes located on the crosswise side rails of the first and second lead frames, and joining the first lead frame to the second lead frame by a welding or soldering process, such that the receiving parts of the leads of the first lead frame are aligned with and located beneath the external connection means of the second lead frame (S2); (3) cutting off the tiebars which had secured the rows of external connection means in place on the second lead frame by using a punching method (S3); (4) attaching a semiconductor chip having a plurality of bonding pads on its active surface to the leads of the first lead frame by using an adhesive means (S4); (5) electrically interconnecting the bonding pads of the semiconductor chip to the inner ends of the leads of the first lead frame using a wire-bonding method (S5); (6) encapsulating the entire assembly in an encapsulant, with the upper surface of the external connection means exposed to the outside (S6); (7) cutting off unnecessary parts of the first and second lead frames using a punching method (S7); and (8) attaching solder balls to the exposed upper surfaces of the external connection means (S8).

With the present invention, it is possible to simplify the package manufacturing process by employing lead frames which can be easily manufactured by a stamping method instead of an etching method, and to use existing manufacturing facilities to manufacture the package.

Further, it is possible to reduce the package manufacturing cost, since a stamping method is less expensive than an etching method in terms of the manufacturing cost of the lead frame.

Thus, the present invention has advantages that chip-size packages can be manufactured by a simple and inexpensive manufacturing process using existing facilities.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A chip-size package comprising:

a first lead frame having a pair of lengthwise side rails and a pair of crosswise side rails, a plurality of rows of leads having receiving parts, the leads and receiving parts integrally formed with each other and with the lengthwise side rails, and a plurality of guide holes formed in the crosswise side rails;

a second lead frame aligned above and joined to the first lead frame, the second lead frame having a pair of lengthwise side rails and a pair of crosswise side rails, a plurality of rows of external connection means located parallel to the lengthwise side rails and aligned above the receiving parts of the plurality of rows of leads on the first lead frame, and a plurality of guide holes formed in the crosswise side rails aligned with the guide holes in the first lead frame; and a semiconductor chip having a plurality of bonding pads on an active surface thereof and bonded to an underside of the first lead frame, the bonding pads of the semiconductor chip being electrically interconnected with inner ends of the leads of the first lead frame;

said first and second lead frames and said semiconductor chip being encapculated as an assembly, such that an upper surface of the external connection means is exposed to outside.

2. The chip-size package of claim 1, further comprising solder balls attached to the exposed upper surface of the external connection means.

3. The chip-size package of claim 1, wherein each one of the external connection means of the second lead frame is larger than or the same size as each one of the receiving parts of the leads of the first lead frame.

4. The chip-size package of claim 1, wherein the electrical interconnection between the bonding pads of the semiconductor chip and the inner ends of the leads of the first lead frame is formed by a wire-bond.

5. The chip-size package of claim 1, wherein the electrical interconnection between the bonding pads of the semiconductor chip and the inner ends of the leads of the first lead frame is formed by TAB (tape automated bonding).

6. The chip-size package of claim 1, wherein the electrical interconnection between the bonding pads of the semiconductor chip and the inner ends of the leads of the first lead frame is formed by bump bonding.

7. The chip-size package of claim 1, wherein the semiconductor chip is adhered to the underside of the first lead frame by a double-sided adhesive polyimide tape.

8. The chip-size package of claim 1, wherein the semiconductor chip is adhered to the underside of the first lead frame by a non-conductive adhesive.

9. The chip-size package of claim 1, wherein the semiconductor chip, and first and second lead frames are encapsulated using an epoxy molding compound.

* * * * *